United States Patent
Chen

(10) Patent No.: US 6,930,947 B2
(45) Date of Patent: Aug. 16, 2005

(54) POWER SOURCE DETECTOR

(75) Inventor: Chieng-Chung Chen, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/604,821

(22) Filed: Aug. 20, 2003

(65) Prior Publication Data
US 2005/0007856 A1 Jan. 13, 2005

(30) Foreign Application Priority Data
Jul. 8, 2003 (TW) ........................................ 92118559 A

(51) Int. Cl.[7] ....................... G11C 5/14; G11C 11/4074; G11C 11/4072
(52) U.S. Cl. ....................................... 365/226; 327/143
(58) Field of Search ................................ 365/226, 227, 365/228, 229; 327/143

(56) References Cited

U.S. PATENT DOCUMENTS

| 5,424,994 A | * | 6/1995 | Nagasawa | ................... | 365/229 |
| 5,874,853 A | * | 2/1999 | Yamaguchi et al. | ........ | 327/545 |
| 5,936,443 A | * | 8/1999 | Yasuda et al. | ............... | 327/143 |
| 6,160,431 A | * | 12/2000 | Crotty | ......................... | 327/143 |
| 6,215,725 B1 | * | 4/2001 | Komatsu | .................... | 365/233 |
| 6,768,354 B2 | * | 7/2004 | Yamazaki et al. | .......... | 327/143 |

* cited by examiner

Primary Examiner—Van Thu Nguyen
Assistant Examiner—J. H. Hur
(74) Attorney, Agent, or Firm—Jianq Chyun IP office

(57) ABSTRACT

A power source detecting circuit of a Dynamic Random Access Memory (DRAM) and an operating method thereof comprise a first power source detector to operate at a good power level, and a second power source detector to operate at an appropriate data power level. The first power source detector receives a first external power, and outputs a signal to indicate whether the first external power is ready for the DRAM to function properly. The second power source detector receives a second external power, and provides a first output state to indicate that the DRAM data power is at a first data power level and a second output state to indicate that the DRAM data power is at a second data power level. After the DRAM receives the data power level indication from the second power source detector, the DRAM automatically configures itself to operate at the corresponding data power level.

10 Claims, 4 Drawing Sheets

POWER SOURCE DETECTOR

CROSS REFERENCE TO RELATED APPLICATIONS

This application claims the priority benefit of Taiwan application serial no. 92118559, filed Jul. 8, 2003.

BACKGROUND OF INVENTION

1. Technical Field

The present invention pertains to an integrated circuit (IC) in general, and more particularly to a power source detecting circuit in an IC that receives two power sources. One is an IC power source, and the other is an IC data power source. The embodiment of the present invention provides a mechanism to automatically adjust the IC to operate at an appropriate data power level.

2. Background Art

In a use of a Dynamic Random Access Memory (DRAM), two different power sources are normally provided to the DRAM. One power source usually named $V_{DD}$ is a DRAM operating power source; the other power source usually named $V_{DDQ}$ is a DRAM data power source. The two power sources may not operate at a same power level. For instance, a typical DRAM operating power source $V^{DD}$ is at 2.5 volts (2.5 V), and its cooperating data power source $V^{DDQ}$ can be at 2.5 volts or at 1.8 volts depending on a use of the DRAM. To be able to ensure that $V_{DD}$ is ready for a DRAM to function normally, a $V_{DD}$ power level detecting circuit is built into the DRAM as depicted in FIG. 6, and FIG. 7. FIG. 6 demonstrates the $V_{DD}$ power level detecting circuit in a block diagram 600. In FIG. 6, an input $V_{DD}$ and an output node A of the power detector 610 are a DRAM operating power source and an output indicating node respectively. As a change state of the output signal A occurs, the DRAM catches this signal and starts to operate at this given power source $V_{DD}$. FIG. 7 provides an instance of the $V_{DD}$ power level detecting circuit depicted in the block diagram in FIG. 6. In FIG. 7, as soon as the output signal A changes states from logic 1 (logic high) to logic 0 (logic low), the DRAM internal circuit is ready to operate under the power source $V_{DD}$. The following paragraph provides a detail description to FIG. 7.

As in an initiation of the power source $V_{DD}$, the voltage level of $V_{DD}$ rises from zero to its steady state voltage level; let's say 2.5 volts. By carefully choosing resistance values of the resistors 710, 720, and 730, before $V_{DD}$ reaches its steady state voltage level, the output signal A is at logic 1. It is noted that at this state, a voltage at a node between resistor 710 and resistor 720 is not enough to turn on transistor 750 so that via resistor 730, the output signal A is pulled up to logic 1. As the voltage level of $V_{DD}$ increases and reaches its steady state voltage level, 2.5 volts, the voltage between resistor 710 and resistor 720 that supplies to the Gate terminal of the transistor 750 is big enough to turn on the transistor 750. Thereby, the transistor 750 is turned on, and the voltage level of the output signal A is pulled down to logic 0. As soon as the output signal A changes states from logic 1 to logic 0, the rest of the DRAM circuit receives the indication and starts to operate at this $V_{DD}$ voltage level.

The current $V_{DD}$ power source detecting scheme works fine in ensuring a DRAM to work at a good power source. Not like $V_{DD}$ power source, however, instead of having a power detecting circuit, a fixed power level is preset to a DRAM data power source during a DRAM fabrication. It is not possible for a DRAM with 2.5 volts preset data power source to work at a 1.8 volts data power level, and vice versa, after the DRAM comes out from a manufactory. The preferred embodiment of the present invention provides a method as well as a circuitry to allow a DRAM automatically detecting an environment $V_{DDQ}$ data power level and self-adjusting to operate at a provided $V_{DDQ}$ data power level properly.

With the present invention, an integrated circuit, such as a DRAM, works flexibly in various data power sources without tying up to a fixed data power source after manufacture. This feature greatly increases IC usability and reduces IC stock problems. For the foregoing reasons, there is a need for a data power level auto-configure circuit that is built in an IC and that can be inexpensively manufactured.

SUMMARY OF INVENTION

The preferred embodiment of the present invention is directed to a circuit that satisfies the need of an IC data power level auto-configuring scheme. The circuit comprises a first power source detector for the IC internal circuits to operate at a good power level, and a second power source detector for the IC to operate at an appropriate data power level automatically. The first power source detector receives a first external power, and outputs a signal to indicate whether the first external power is ready for the IC to function properly. The second power source detector receives a second external power, and provides a first output state to indicate that the IC data power is at a first data power level and a second output state to indicate that the IC data power is at a second data power level. After the IC receives the data power level indication from the second power source detector, the IC automatically configures itself to operate at the corresponding data power level.

As demonstrated in the previous paragraph, the first and the second power source detectors operate independently. However, the second power source detector can also depend on the output of the first power source detector to turn on its power level detecting function. In this case, the output of the first power source detector acts like a switch to the second power source detector. A good power indication of the first power source detector turns on the second power source detector to detect the second external power level. With this scheme, a possible current leak in an integrated circuit can be greatly eliminated.

The preferred embodiment of the present invention also provides a method of detecting power sources in an integrated circuit (IC). The method receives a first power source, and a second power source. From an analytical point of view, the method contains a first power detector sub-method and a second power detector sub-method. Upon receiving the first power source, the first power detector sub-method determines whether the first received power source is at a good power level, and provides a first output signal to indicate the detecting results. Upon receiving the second power source, the second power detector sub-method discerns a power level of the second power source and provides a second output signal that is at a first state to indicate a first power level and at a second state to indicate a second power level of the second power source. Optionally, the method also provides a current leak elimination scheme that has the first output signal to act as a trigger to the second power detector sub-method. The second power detector sub-method only functions when it receives a good power source indication from the first power detector sub-method.

The preferred embodiment of the present invention is particularly useful in resolving the DRAM data power source configuration problem addressed in the prior art section. Before a DRAM comes out from a manufactory, its data power lines are preset to work at a given power level. This preset data power level scheme adds one more data entry to a DRAM data book. A possible human mistake may occur when a DRAM is put in a wrong data power source; and DRAMs with same specification but different data power levels also increase a DRAM stock load. With the version of the present invention these named problems are resolved effectively and inexpensively. The version of the present invention can be used in DRAM fabrication, and can also be used in other integrated circuit (IC) fabrication as needed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The preferred embodiment of the present invention contains a power sources detecting method and a power sources detecting circuit. From an analytical point of view, the power sources detecting method can be decomposed into a first power detecting sub-method and a second power detecting sub-method. Same as in the power sources detecting circuit, a first power detecting circuit and a second power detecting circuit can be derived from the power sources detecting circuit. In the following paragraphs, the detecting method followed by the detecting circuit is demonstrated in detail.

Figure 1:
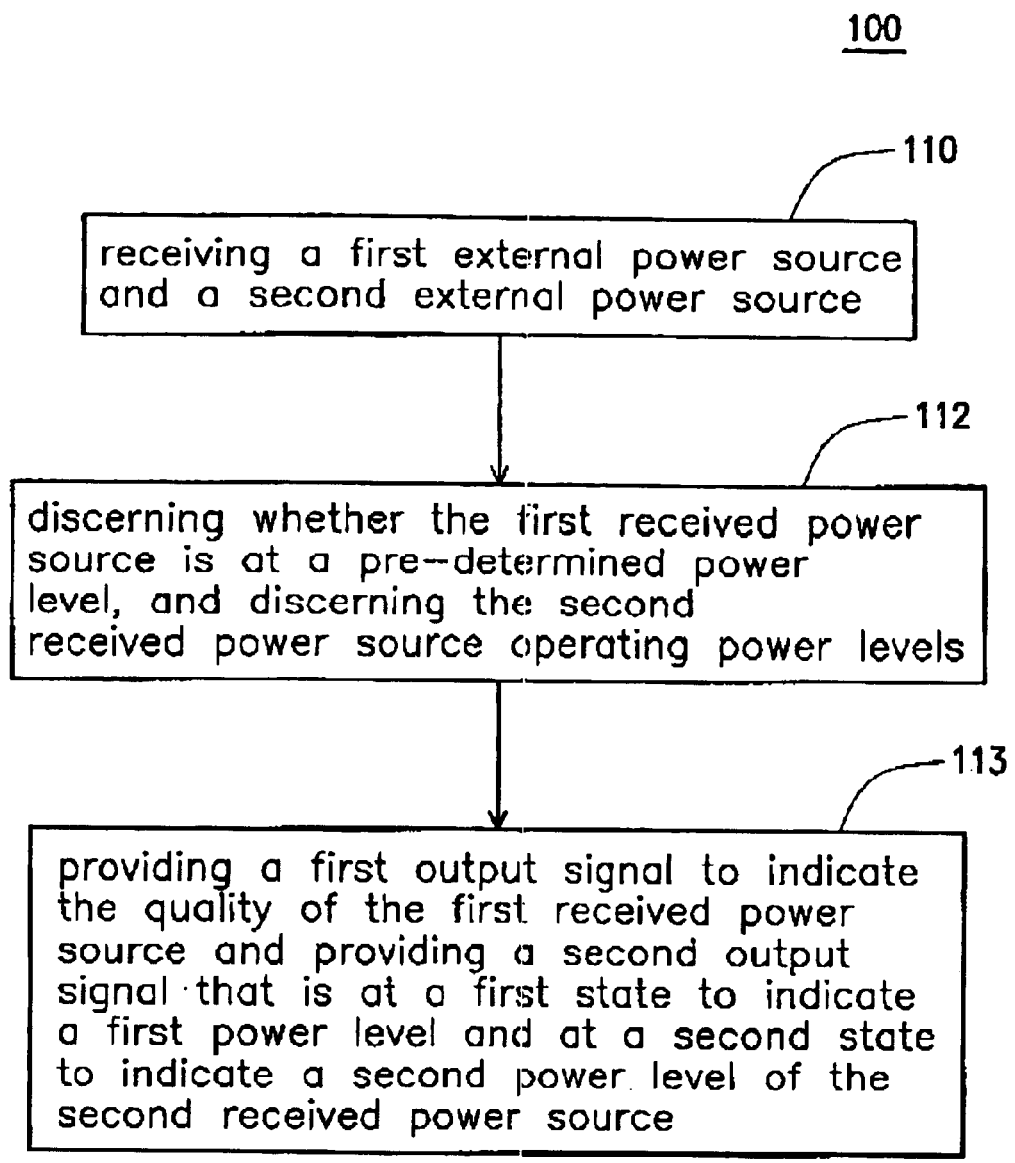
FIG. 1 demonstrates the power sources detecting method of the preferred embodiment of the present invention in a flow chart diagram.

FIG. 1 depicts the power sources detecting method of the preferred embodiment of the present invention in a flow chart diagram 100. In general, the power sources detecting method can be exploited in any IC as needed. A procedure of the method of the preferred embodiment of the present invention is described as follows. In step 110, the method first receives a first external power source and a second external power source. Internally, the method directs the first external power to the first power detecting sub-method and the second external power to the second power detecting sub-method. Without a loss of a generality, the first power detecting sub-method is usually directed to an external power source that supplies a major power consumption of an integrated circuit (IC). Meanwhile, the second power detecting sub-method is directed to another external power source that supplies the power consumption of the IC data lines. Therein, the first power detecting sub-method provides a power source quality indication to inform the IC internal circuit whether the external power is ready to be used. The second power detecting sub-method provides a power source level indication to inform the IC to work at a right data power level. Therefore, in FIG. 1, the method is next to discern whether the first received power source is at a good power level, and to discern the operating power level of the second received power source in step 112. After then, a first output signal and a second output signal are provided. The first output signal indicate the quality of the first received power source, and the second output signal provides a first state to indicate a first power level and a second state to indicate a second power level of the second received power source in step 113.

Optionally, to eliminate possible current leak in the integrated circuit, the second power detecting sub-method can be driven by the first power detecting sub-method so that unless the first power detecting sub-method indicates a good external power supply, the second power detecting sub-method is in a shut-down mode. The dependency on the first power detecting sub-method makes sense when the first power detecting sub-method is used to detect an IC major power supply. The argument is that if the IC major power supply doesn't even come up right, why bother to detect its minor power supply which is a data power level in lots of cases. Keeping this design scheme in the method, a possible current leak or unnecessary power consumption of an IC can be greatly eliminated.

Figure 2:
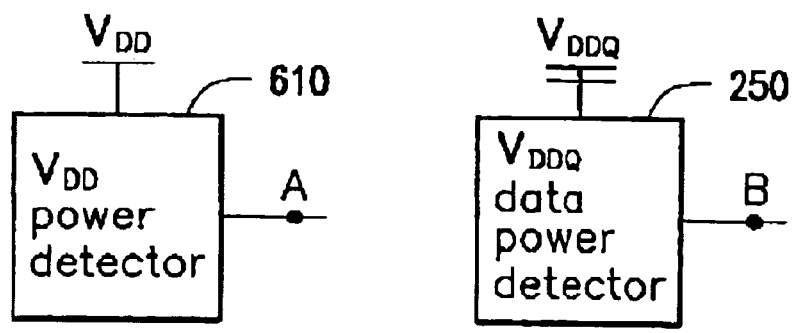
FIG. 2 depicts the version of the present invention in a high level block diagram.
Figure 3:
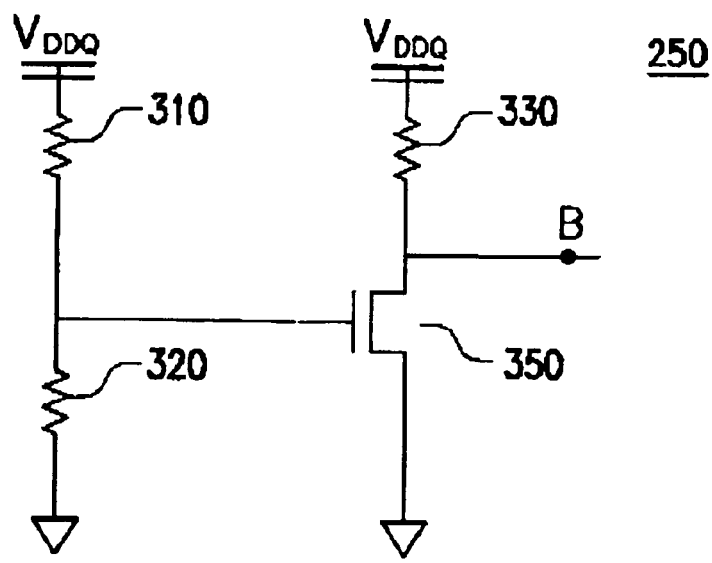
FIG. 3 provides an instance of the $V_{DDQ}$ data power detector depicted in FIG. 2.
Figure 4:
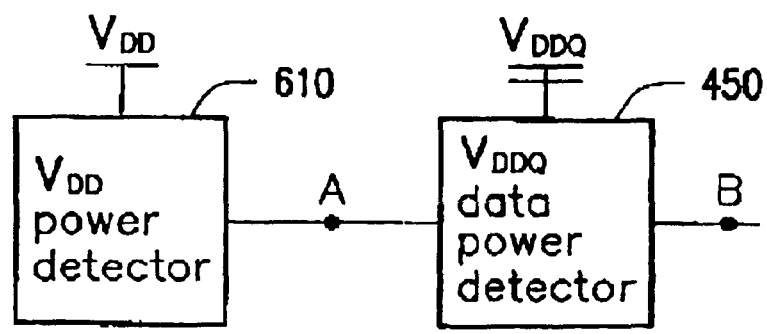
FIG. 4 shows how two power detectors are cooperated together to eliminate current leak in a high-level block diagram.
Figure 5:
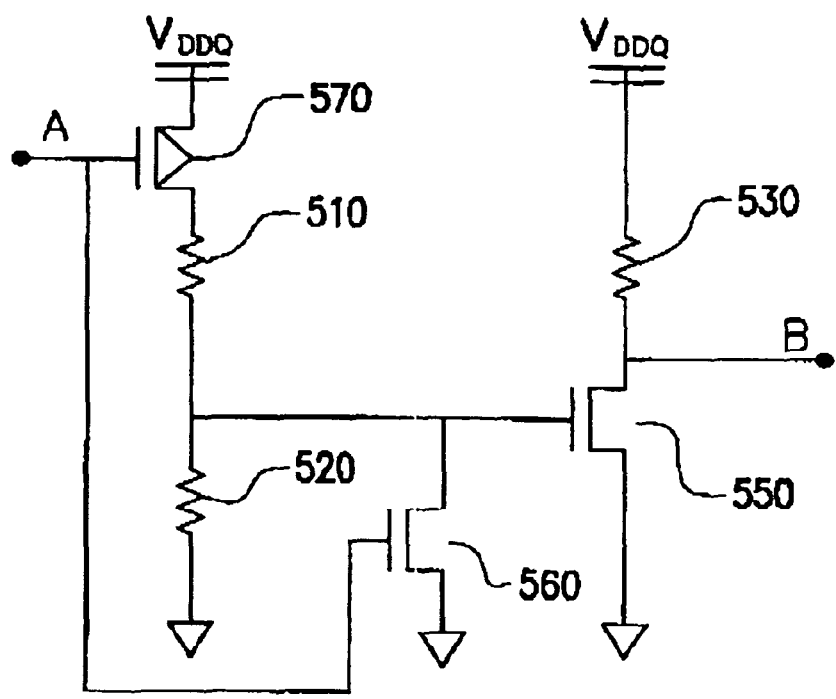
FIG. 5 demonstrates an instance of the $V_{DDQ}$ data power detector in FIG. 4.
Figure 6:
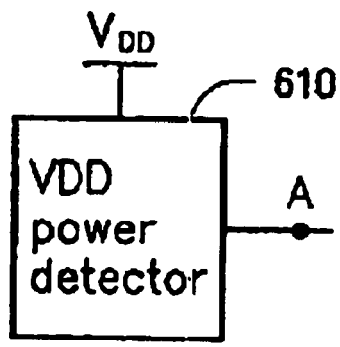
FIG. 6 depicts a commonly used power source detector in an integrated circuit (IC) in a high-level block diagram.

Accordingly, curdling the method down to an integrated circuit level, two power sources detecting circuits are contributed to the preferred embodiment of the present invention. FIG. 2 and FIG. 3 present a power sources detecting circuit without equipped with a current leak eliminating scheme. FIG. 4 and FIG. 5 present a power sources detecting circuit equipped with the current leak eliminating scheme.

First, FIG. 2 is a high-level block diagram 200 that depicts the power source detecting circuit without equipped with the current leak eliminating scheme. Clearly, the first power detecting sub-method and the second power detecting sub-method are realized in $V_{DD}$ power detector 610 and $V_{DDQ}$ data power detector 250 respectively in FIG. 2. A detail circuit diagram of the $V_{DDQ}$ data power detector 250 in FIG. 2 is demonstrated in FIG. 3, and is explained as follows. By carefully choosing resistance values of the resistors 310, 320, and 330 in FIG. 3, the transistor 350 will turns on or off according to $V_{DDQ}$ power level so that provides a first state at node B to indicate a first $V_{DDQ}$ power level and a second state at node B to indicate a second $V_{DDQ}$ power level. For example, two different power levels 2.5 volts and 1.8 volts may apply to $V_{DDQ}$. By carefully choosing the resistance values of resistors 310, 320, and 330, the transistor 350 will turns on at 2.5 volts $V_{DDQ}$ power level and turns off at 1.8 volts $V_{DDQ}$ power level. Therefore, logic zero at node B indicates $V_{DDQ}$ is at 2.5 volts, and logic1 at node B indicates $V_{DDQ}$ is at 1.8 volts. With this indication, data power lines of an integrated circuit (IC) like a DRAM do not need to get preset to a fixed data power level during the IC fabrication, and the data power level of the IC data power lines is automatically self-configured during the IC power-up. This simple, inexpensive power sources detecting circuit effectively resolves an IC stock problem and eliminates a possible human error in using an IC at its wrong power level.

Figure 7:
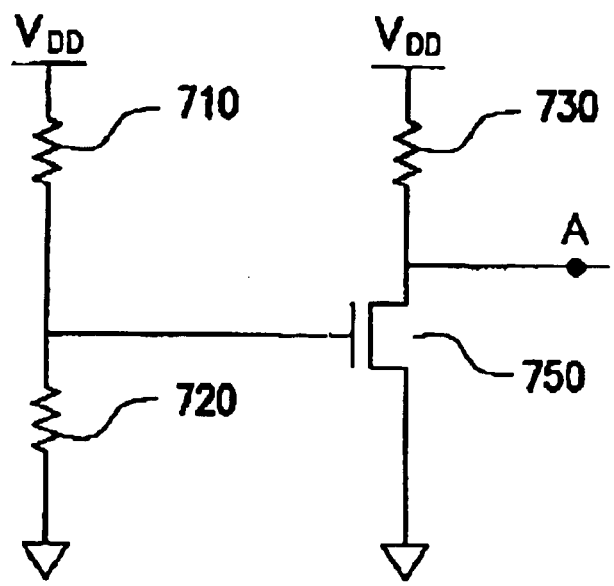
FIG. 7 provides an instance of the power source detector in FIG. 6.

FIG. 4 is a high-level block diagram 400 that depicts the power source detecting circuit equipped with the current leak eliminating scheme. Clearly, the first power detecting sub-method and the second power detecting sub-method are realized in $V_{DD}$ power detector 610 and $V_{DDQ}$ data power detector 450 respectively in FIG. 4. An instance of the $V_{DD}$ power detector 610 is depicted in FIG. 7 and described in detail in the prior art section. An instance of the $V_{DDQ}$ data power detector 450 is demonstrated in FIG. 5, and is explained as follows. It is noted that the resistors 510, 520, 530, and the transistor 550 in FIG. 5 are correspondent with the resistors 310, 320, 330, and the transistor 350 in FIG. 3. Same as in FIG. 3, resistors 510, 520, 530 serve as a $V_{DDQ}$ power level discerning elements that accurately turn transistor 550 on and off at preset power levels. The transistor 570 is a P-channel transistor, and the transistor 560 is a N-channel transistor; they operate oppositely: one turns on, the other turns off. Recall that the signal at node A going from logic 1 to logic 0 indicates that $V_{DD}$ power source is ready for the IC to work properly. During the signal at node A at logic 1 period, P-channel transistor 570 turns off, and N-channel transistor 560 turns on. The P-channel transistor 570 at off state blocks $V_{DDQ}$ power source from reaching the $V_{DDQ}$ data power detector, and the N-channel transistor 560 at on state shorts the Gate terminal of the transistor 550 to ground reference voltage level that turns off the transistor 550. As a result, the transistors 560 and 570 shut down $V_{DDQ}$ data power detector during the major IC power source not-ready period. As the signal at node A goes from logic 1 to logic 0, that the P-channel transistor 570 turns on, and the N-channel transistor 560 turns off makes the circuit in FIG. 5 to function exactly the same as the circuit in FIG. 3. Clearly, by adding the transistors 560 and 570 to $V_{DDQ}$ data power detector some possible current leak is greatly eliminated during the major IC power source not-ready period.

The embodiment of the present invention is particularly useful to a DRAM automatically self-configuring its data power level. However, the embodiment of the present invention can also be used in other integrated circuit (IC) design as needed. Also, all the transistors in the figures presented in the preferred embodiment of the present invention are presented in Metal Oxide Semiconductor Field Effect Transistor (MOSFET). However, any other circuit elements with transistor functionality in general can be used to replace all the MOSFET in the preferred embodiment of the present invention to achieve the same power sources detecting functionality.

It will be apparent to those skilled in the art that various modifications and variations can be made to the structure or to the methods of the preferred embodiment of the present invention without departing from the scope or spirit of the invention. In view of the foregoing, it is intended that the present invention cover modifications and variations of this invention provided they fall within the scope of the following claims and their equivalents.

What is claimed is:

1. A method of detecting power sources in a Dynamic Random Access Memory (DRAM), which comprises:

receiving a first power source, and a second power source; and discerning whether the first received power source is at a pre-determined power level, and providing a first output signal accordingly to indicate a power level of the first power source, wherein when the first output signal indicates that the first power source is at the pre-determined power level, a power level of the second power source is detected, and a second output signal is provided to indicate a power level of the second power source, a first state of the second output signal indicates a first power level of the second power source, and a second state of the second output signal indicates a second power level of the second power source.

2. A power source detecting circuit for detecting a power source in a Dynamic Random Access Memory (DRAM), which comprises:

a first power source detector for detecting whether the DRAM operates at a first pre-determined power level, and providing a first output signal to indicate a power level of a first power source;

a second power source detector for detecting whether the DRAM operates at a second pre-determined power level, and providing a second output signal to indicate a power level of a second power source, wherein a first state of the second output signal allows the DRAM to operate at a first data power level, and a second state of the second output signal allows the DRAM to operate at a second data power level.

3. The power source detecting circuit of claim 2, wherein the second power source detector provides the first state to indicate the first data power level of the DRAM, and provides the second state to indicate the second data power level of the DRAM.

4. The power source detecting circuit of claim 2, wherein the first power source detector receives an external power and provides the first output signal to indicate whether the external power allows the DRAM to function normally.

5. The power source detecting circuit of claim 4, wherein the second power source detector receives an external data power and the first output signal, and the second power source detector detects the external data power only when the first output signal indicates that the DRAM functions normally.

6. The power source detecting circuit of claim 4, wherein the first output signal of the first power source detector changes state from a high logic state to a low logic state to indicate that the external power source allows the DRAM to function normally.

7. The power source detecting circuit of claim 2, wherein the second power source detector comprises:
   a first resistor electrically connecting to an external data power source at one end;
   a second resistor electrically connecting to the other end of the first resistor at one end, and electrically connecting to a ground reference at the other end;
   a third resistor electrically connecting to the external data power source at one end;
   a transistor electrically connecting to a node between the first resistor and the second resistor at a first end, electrically connecting to the ground reference at a second end, and electrically connecting to the other end of the third resistor that is also the output of the second power source detector at a third end.

8. The power source detecting circuit of claim 7, wherein the transistor is a Metal Oxide Semiconductor Field Effect Transistor (MOSFET), and the first end is a gate, the second end is a source, and the third end is a drain.

9. The power source detecting circuit of claim 7, wherein the transistor is a bipolar transistor.

10. The circuit in claim 2, wherein the second power source detector comprises:
   a P-channel transistor electrically connecting to the external data power at a drain, electrically receiving the output signal of the first power source detector at a gate;
   a first resistor electrically connecting to a source of the P-channel transistor at one end;
   a second resistor electrically connecting to the other end of the first resister at one end and electrically connecting to a ground reference at the other end;
   a first N-channel transistor electrically receiving the output of the first power source detector at a gate, electrically connecting to the ground reference at a source, and electrically connecting to a node between the first resistor and the second resistor at a drain;
   a third resistor electrically connecting to the external data power at one end; and
   a second N-channel transistor electrically connecting to the node between the first resistor and the second resistor at a gate, electrically connecting to the ground reference at a source, and electrically connecting to the other end of the third resistor at a drain to form the output of the second power source detector.

* * * * *